(12) United States Patent
Müller et al.

(10) Patent No.: US 10,297,976 B2
(45) Date of Patent: May 21, 2019

(54) LOW THERMAL RESISTANCE, STRESS-CONTROLLED DIODE LASER ASSEMBLIES

(71) Applicant: II-VI Laser Enterprise GmbH, Zürich (CH)

(72) Inventors: Jürgen Müller, Winterthur (CH); Rainer Bättig, Zürich (CH); Reinhard Brunner, Arni (CH); Stefan Weiss, Langnau am Albis (CH)

(73) Assignee: II-VI Laser Enterprise GmbH, Zurich (CH)

( * ) Notice: Subject to any disclaimer, the term of this patent is extended or adjusted under 35 U.S.C. 154(b) by 244 days.

(21) Appl. No.: 15/155,152

(22) Filed: May 16, 2016

(65) Prior Publication Data

US 2016/0344160 A1 Nov. 24, 2016

Related U.S. Application Data

(60) Provisional application No. 62/163,518, filed on May 19, 2015.

(51) Int. Cl.
*H01S 5/024* (2006.01)
*H01S 5/40* (2006.01)
(Continued)

(52) U.S. Cl.
CPC ...... *H01S 5/02476* (2013.01); *H01S 5/02469* (2013.01); *H01S 5/02492* (2013.01);
(Continued)

(58) Field of Classification Search
CPC .. H01S 5/02476; H01S 5/3013; H01S 5/4031; H01S 5/02492; H01S 5/4025; H01S 5/02469; H01S 5/0224; H01S 5/026
See application file for complete search history.

(56) References Cited

U.S. PATENT DOCUMENTS 5,848,082 A 12/1998 Shum
5,848,083 A 12/1998 Haden et al.
(Continued)

FOREIGN PATENT DOCUMENTS

JP 2012 222130 A 11/2012
WO WO 2008/105064 9/2008

OTHER PUBLICATIONS

Murata S., et al., "Theoretical and Experimental Evaluation of the Effect of Adding a Heat-Bypass Structure to a Laser Diode Array", Japanese Journal of Applied Physics, Japan Society of Applied Physics, vol. 32 (1993), No. 3A, Part 01, pp. 1112-1119.

*Primary Examiner* — Xinning (Tom) Niu
(74) *Attorney, Agent, or Firm* — Wendy W. Koba

(57) ABSTRACT

A diode laser bar assembly is formed to exhibit a relatively low thermal resistance, which also providing an increased range of conditions over which the internal stress conditions may be managed. In particular, the submount configuration of the prior art is replaced by a pair of platelets, disposed above and below the diode laser bar so as to form a "sandwich" structure. The bottom platelet is disposed between the heatsink (cooler) and the diode laser bar. Thus, the bottom platelet may be relatively thin, creating a low thermal resistance configuration. The combination of the top and bottom platelets provides the ability to create various configurations and designs that best accommodate stress conditions for a particular situation.

17 Claims, 10 Drawing Sheets

(51) Int. Cl.
*H01S 5/30* (2006.01)
*H01S 5/022* (2006.01)
*H01S 5/026* (2006.01)

(52) U.S. Cl.
CPC .......... *H01S 5/3013* (2013.01); *H01S 5/4025* (2013.01); *H01S 5/4031* (2013.01); *H01S 5/026* (2013.01); *H01S 5/0224* (2013.01)

(56) References Cited

U.S. PATENT DOCUMENTS

| | | |
|---|---|---|
| 6,137,815 A | 10/2000 | Sasao et al. |
| 6,195,376 B1 | 2/2001 | Wilson et al. |
| 6,352,873 B1 | 3/2002 | Hoden |
| 6,535,533 B2 | 3/2003 | Lorenzen et al. |
| 6,895,027 B2 | 5/2005 | Treusch et al. |
| 7,154,926 B2 | 12/2006 | Kouta et al. |
| 7,816,155 B2 | 10/2010 | Wong et al. |
| 7,864,825 B2 | 1/2011 | Thiagarajan et al. |
| 7,957,146 B2 | 6/2011 | Kraus et al. |
| 8,320,419 B2 | 11/2012 | Krejci et al. |
| 8,565,276 B2 | 10/2013 | Krejci et al. |
| 8,792,527 B2 | 7/2014 | Grove |
| 9,450,377 B1 * | 9/2016 | Roff .................. H01S 5/005 |
| 2009/0104727 A1 * | 4/2009 | Krejci ................. H01S 5/4031 438/46 |

\* cited by examiner

LOW THERMAL RESISTANCE, STRESS-CONTROLLED DIODE LASER ASSEMBLIES

CROSS-REFERENCE TO RELATED APPLICATIONS

This application claims the benefit of U.S. Provisional Application Ser. No. 62/163,518, filed May 19, 2015 and herein incorporated by reference.

TECHNICAL FIELD

The present invention relates to diode laser bar assemblies and, more particularly, to an assembly that addresses the competing concerns of providing low thermal resistance while accommodating stress-induced limitations in performance and endurance.

BACKGROUND OF THE INVENTION

Diode bars are high-power semiconductor lasers containing a one-dimensional array of broad-area emitters or, alternatively, subarrays containing 10-20 narrow stripes. Diode bars typically contain between 20 and 50 emitters, each being about 100 µm wide. A typical commercial device may comprise a laser resonator length on the order of 1-5 mm, with a width of about 10 mm. This size of device is capable of generating tens to hundreds of watts of output power without much difficulty. Power levels up to 250 W continuous output power are commercially available.

Electrically, the set of emitter regions are all connected in parallel, thus requiring a substantial drive current (particularly for configurations of 50 emitters or more), and may be on the order of tens (or even hundreds) of amps, with a rough rule-of-thumb being that one watt of output power is provided for every amp of input current. Important design parameters of diode bars are based upon the numbers of emitters, their width and spacing. With respect to beam quality and brightness, it is ideal to obtain the output power from a small number of closely-spaced emitters.

The need to operate at high powers results in a significant quantity of heat being generated. In order to maintain acceptable performance of the diode laser over a reasonable lifespan (say, 20 kh or more), the diode bar needs to be mounted onto a heatsink or provided in some type of arrangement with a low thermal resistance. Conventional heatsink materials (such as copper) exhibit a coefficient of thermal expansion (CTE) that is different from the CTE of the diode laser bar itself. The mis-match in CTE results in creating mechanical stress between the heatsink and diode laser bar during the high-temperature process of attaching the diode laser bar to the heatsink. At the elevated temperature required for the soldering process, the heatsink expands to a greater extent than the diode laser bar. As the combination returns to room temperature and both the heatsink and diode laser bar contract, the heatsink will contract more than the diode laser bar, creating a mechanical stress at their interface which is considered to be "frozen" into the configuration. While operational temperatures are somewhat elevated compared to room temperature, only a slight amount of stress relief may be expected.

The presence of the stress results in the formation of a curvature along the lateral extent of the diode laser bar (also referred to at times as a "smile"). This unwanted smile artifact is known have detrimental effects on the ability to focus beams from diode bars.

Thus, a need remains for a diode laser bar assembly that is able to accommodate the changes in stress associated CTE mis-match, while also maintaining a relatively low value of thermal resistivity.

SUMMARY OF THE INVENTION

The needs remaining in the prior art are addressed by the present invention, which relates to diode laser bar assemblies and, more particularly, to an assembly that addresses the competing concerns of providing low thermal resistance while accommodating stress-induced variations in performance and lifetime.

In accordance with the present invention, the submount configuration of the prior art is replaced by a pair of platelets, disposed above and below the diode laser bar so as to form a "sandwich" structure. The bottom platelet is disposed between the heatsink (cooler) and the diode laser bar. Thus, the bottom platelet may be relatively thin, creating a low thermal resistance configuration. The combination of the top and bottom platelets provides the ability to create various configurations and designs that best accommodate stress conditions for a particular situation.

In particular, the materials used to form the top and bottom platelets, as well as the thicknesses of the platelets can be controlled to optimize the performance of the diode laser bar assembly. Indeed, the platelets may be formed of different materials and/or may exhibit different thicknesses. These multiple variations allow for an application-specific tailoring of the stress situation to be incorporated into the device.

The pair of platelets, used in combination with the expansion properties of the heatsink, provides for mechanical stress management in the overall assembly. By using a pair of separate platelets (as opposed to the conventional prior art single submount), the range of stress conditions that can be accommodated is widened. That is, the addition of top platelet creates additional situations and possibilities for controlling the mechanical stress within the diode laser bar. At the same time, the bottom platelet can be relatively thin (when compared to the thickness of prior art submounts), thus lowering the thermal resistance of the assembly and enhancing the efficiency of the heat transfer from diode laser bar to the heatsink.

One particular embodiment of the present invention takes the form of a diode laser bar assembly comprising a bar of semiconductor laser diodes including an array of emitter regions disposed in a lateral direction across a front facet of the bar (the bar including a bottom major surface and an opposing top major surface, the front facet extending orthogonally between the top and bottom major surfaces), a heatsink, and a pair of platelets used to create a "sandwich" with the diode laser bar. In particular, the pair of platelets includes a bottom platelet disposed between the heat sink and the bottom major surface of the bar of semiconductor laser diodes and a top platelet disposed over and affixed to the top major surface of the bar of semiconductor laser diodes, the dimensions and materials selected for the bottom platelet and the top platelet chosen to create a low thermal resistance path between the bar of semiconductor laser diodes and the heatsink, while also managing stress conditions within the assembly.

Other and further embodiments and aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
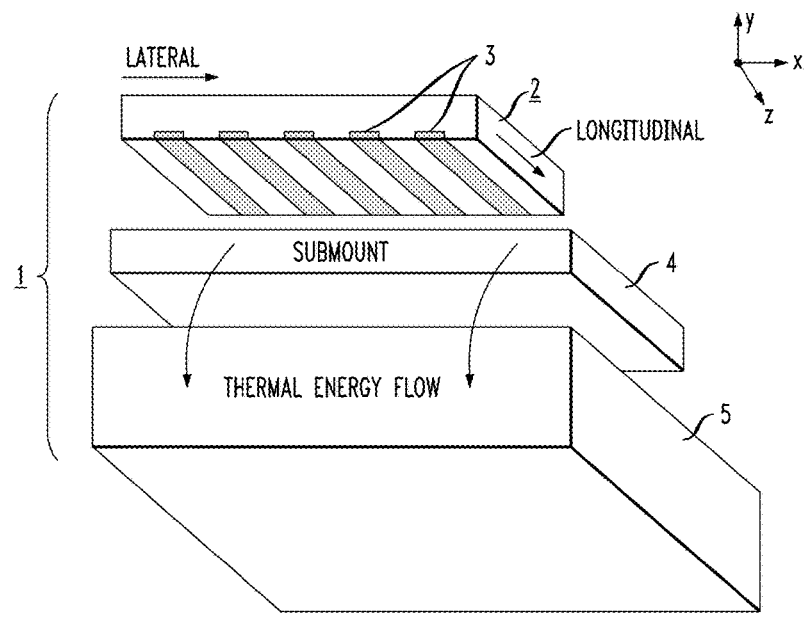
FIG. 1 is an exploded, isometric view of a conventional prior art diode laser bar assembly.

FIG. 1 is an exploded, isometric view of a conventional prior art diode laser bar assembly 1. In this simplified illustration, a diode laser bar 2 is shown as including a plurality of five separate emitting regions (or stripes) 3, disposed as a one-dimensional array configuration along the x-axis direction of diode laser bar 2 (a "diode laser bar" may also be referred to below as a "bar of semiconductor laser diodes"). Diode laser bar 2 is disposed over and attached to a submount 4, which is in turn disposed over and attached to a heatsink (cooler) 5. As shown, diode laser bar 2 is oriented with light emitting regions 3 being positioned "downward", toward submount 4.

Submount 4 is formed of a conductive material that functions as one electrical contact for diode laser bar 2. While serving as this electrical contact, submount 4 also functions as a conduit for the thermal energy (heat) created when diode laser bar 2 is active, directing the thermal energy away from diode laser bar 2 and into underlying heatsink 5. The upside-down orientation of diode laser bar 2 thus positions the elements generating heat (that is, emitting regions 3) closer to submount 4, providing a relatively short path for the thermal energy to travel.

Figure 3:
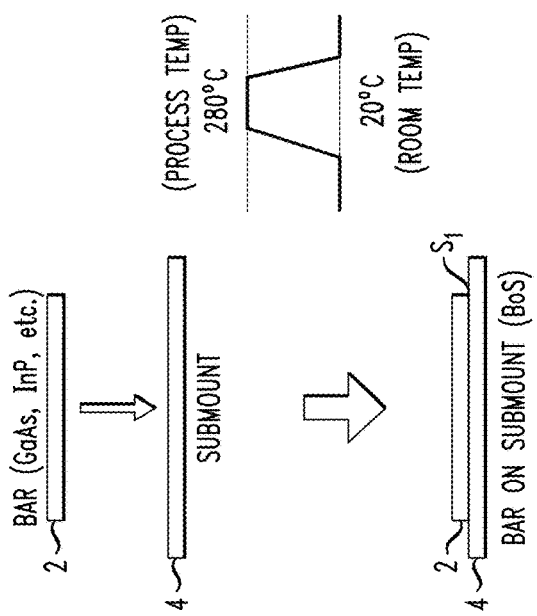
FIG. 3 is a simplified diagram illustrating a following step of attaching the assembly shown in FIG. 2 to a heatsink.
Figure 2:
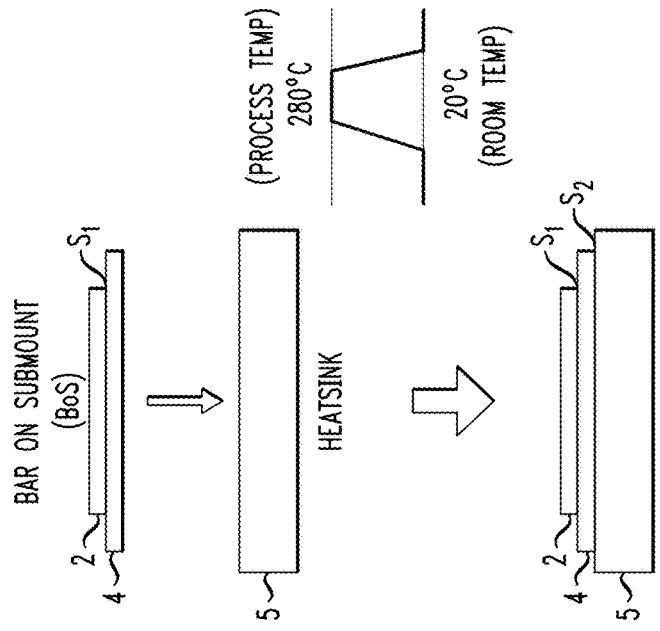
FIG. 2 is a simplified diagram illustrating an initial step of attaching a diode laser bar to an associated submount.

As mentioned above, copper is an excellent material to use at a heatsink in terms of its low thermal resistivity (providing an efficient path to transfer unwanted heat away from the diode laser bar). A remaining problem, however, is the mis-match in CTE between the heatsink and the diode laser bar, resulting in creating mechanical stress within the assembly that remains "frozen" within the system. FIGS. 2 and 3 are useful in understanding the basic assembly operations that create this unwanted stress that appears in the form of the smile along the lateral direction of the emitter regions.

FIG. 2 illustrates the process of attaching diode laser bar 2 to submount 4. In most cases, diode laser bar 2 comprises a III-V based laser diode bar (such as GaAs or InP, for example), which exhibits a coefficient of thermal expansion (CTE) of about 6.5 ppm/K. One conventional submount material is referred to as $Cu_{10}W$, which is a homogenized combination of 10% copper (Cu) and 90% tungsten (W) that exhibits a CTE essentially matching the diode laser bar. A "hard" solder (that is, a solder such as AuSn with a solidus of about 280° C.) is used to attach diode laser bar 2 to submount 4, resulting the "bar-on-submount" (BoS) arrangement as shown in FIG. 2. The use of a hard solder requires that the ambient temperature be raised to at least 280° C. so that the solder will begin to flow and adhere to both bar 2 and submount 4. This solder attachment is designated as $S_1$ in FIG. 2.

As the ambient temperature is elevated from room temperature (about 20° C. to the solder process temperature of 280° C.), both diode laser bar 2 and submount 4 will experience some expansion. Since their respective CTEs are very similar, both components will expand by about the same amount. As the BoS assembly cools down and returns to room temperature, both components will shrink by about the same amount, resulting in little or no stress apparent at the interface of solder attachment $S_1$.

A following step in the assembly process is to attach the BoS configuration to heatsink 5, as shown in FIG. 3. Heatsink 5 is typically formed of copper, which has a CTE of 16 ppm/K. Again, a hard solder with a solidus of 280° C. is used to attach the BoS to heatsink 5. As the ambient temperature is raised from room temperature to the process temperature, heatsink 5 will experience a greater degree of expansion than the BoS configuration (associated with the significant mis-match in CTE). Thus, as the assembly cools down and returns to room temperature, the larger shrinkage of heatsink 5 (when compared to the BoS) results in creating a mechanical stress in the region where the BoS is attached to heatsink 5 (that is, along the solder interface shown as S2 in FIG. 3). This stress is thereafter considered as being "frozen" within the structure, since it will remain during the lifetime of the assembly.

Figure 4:
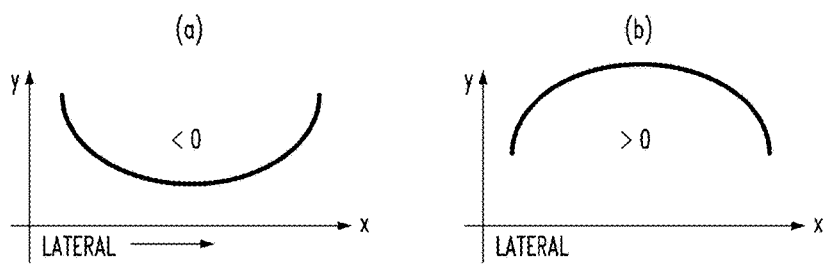
FIG. 4 contains a pair of graphs depicting the presence of a "smile" (bow or curvature) along a front facet of a diode laser bar resulting from the assembly process shown in FIGS. 2 and 3.

As mentioned above, persons skilled in the art use the term "smile" as a descriptor of this temperature-induced stress because of its appearance. The "smile" of a diode laser bar in this context is defined as the warping or curvature or bow of a laser device across the face of the bar which is in the plane orthogonal to the emitted light beam; that is, orthogonal to emitted light beam (in the lateral direction). Thus, looking head-on into the light-emitting facets of the laser diodes of the bar, the various facets do not form a straight line. FIG. 4 depicts two different results of this unwanted curvature, where graph (a) shows bow values less than zero and graph (b) shows bow values greater than zero.

Solutions to this smile problem need to also provide long-term stable mounting under harsh operating conditions, while continuing to exhibit efficient heat transfer away from the diode laser bar. Management of the stress factors within the assembly are known to extend the useful life of the light source, where in some instances it is desirable to be able to control the stress such that a desired polarization state can be selected (which is typically a "pure" polarization along one of the main axes of the device).

Indeed, while the stress profile across the lateral direction of the assembly is evident in terms of the smile/curvature that is created, stress in the longitudinal direction of the assembly is also problematic (particularly in polarization-controlled assemblies) and in general the issue of "stress control" or "stress management" in a diode laser bar assembly requires that attention be given to both the lateral and longitudinal stress components.

Figure 5:
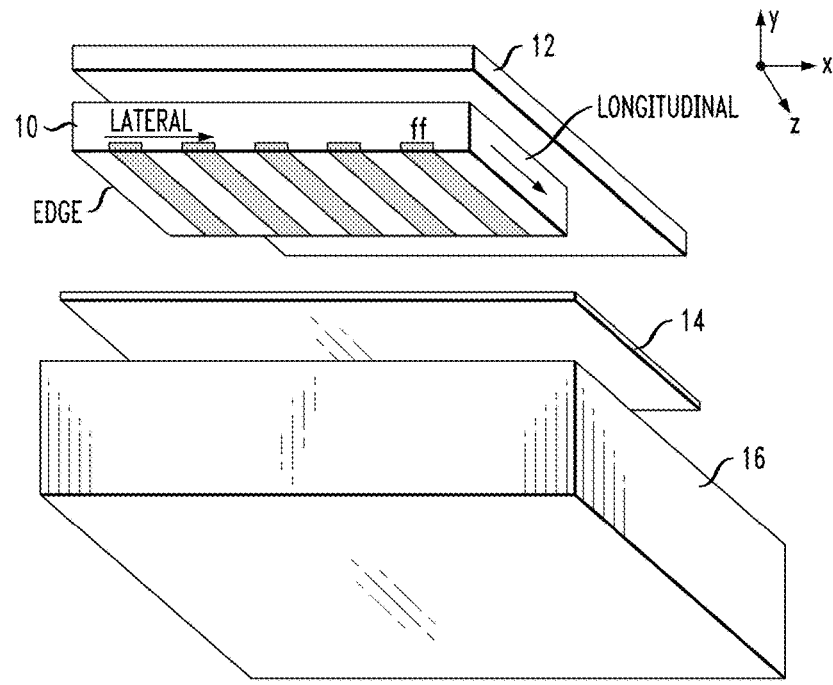
FIG. 5 is an exploded, isometric view of an exemplary low thermal resistance, stress-controlled diode laser bar assembly, using a sandwich of platelets, formed in accordance with the present invention.

FIG. 5 is an exploded, isometric view (similar in form to FIG. 1) of a low thermal resistance, stress-controlled diode laser bar assembly formed in accordance with the present invention. The assembly utilizes a sandwich structure in the form of a pair of platelets that are placed above and below the diode laser bar. The pair of platelets, in combination with the expansion properties of the heatsink, provides for mechanical stress management in the overall assembly. By using a pair of separate platelets (as opposed to the conventional prior art single submount as shown in FIG. 1), the range of stress conditions that can be accommodated is widened. That is, the addition of a top platelet creates additional situations and possibilities for controlling the mechanical stress within diode laser bar (particularly, but not limited to, preventing or at least reducing the emission line "smile"). At the same time, the bottom platelet can be relatively thin (when compared to the thickness of prior art submounts), thus lowering the thermal resistance of the assembly and enhancing the efficiency of the heat transfer from the diode laser bar to the heatsink.

Figure 6:
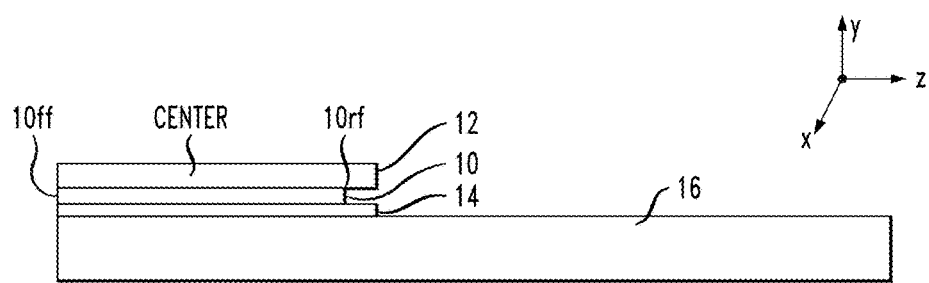
FIG. 6 is a cut-away side view of the inventive assembly of FIG. 5.

As shown, the configuration of the present invention takes the form of a "sandwich" type of assembly, where a conventional diode laser bar 10 (i.e., a "bar of semiconductor laser diodes) is disposed between a top platelet 12 and a bottom platelet 14, with bottom platelet 14 attached to a heatsink 16. FIG. 6 is a cut-away side view of the assembly, with the front facet (ff) of diode laser bar 10 shown on the left-hand side of the drawing. The orientation of FIG. 6 clearly shows the longitudinal axis (here, along the z-axis direction) of the structure, extending from the front facet $10_{ff}$ to a back facet (bf) of diode laser bar 10, shown as $10_{bf}$.

The pair of platelets 12, 14, used in combination with the expansion properties of heatsink 16, provides for mechanical stress management in the overall assembly. By using a pair of separate platelets (as opposed to the conventional prior art single submount as shown in FIG. 1), the range of stress conditions that can be accommodated is widened. That is, the addition of top platelet 12 creates additional situations and possibilities for controlling the mechanical stress within laser diode bar 10 (particularly, but not limited to, preventing or at least reducing the emission line "smile"). At the same time, bottom platelet 14 can be relatively thin (when compared to the thickness of prior art submounts), thus lowering the thermal resistance of the assembly and enhancing the efficiency of the heat transfer from diode laser bar 10 to heatsink 16.

In accordance with the present invention, various suitable materials may be used to form top platelet 12 and bottom platelet 14; indeed, it is not required for the platelets to be formed of the same material. And as mentioned above, it is quite possible that bottom platelet 14 is thinner than top platelet 12. In general, the materials and dimensions of platelets 12 and 14 are chosen in a way that creates the desired stress and thermal resistance properties for a given application.

In one exemplary embodiment of the present invention, top platelet 12 and bottom platelet 14 are formed of materials that exhibit a room temperature CTE of about 2-6 ppm/K. Examples of materials that fit this criterion include molybdenum, silicon and $Cu_xW$ (where $x \leq 8$). In other embodiments, materials with a higher CTE (e.g., CTE>7.2-10) may be used, since the utilization of a pair of platelets in accordance with the present invention creates a uniform strain condition (albeit compressive) across both major surfaces of diode laser bar 10. Materials such as, for example, $Cu_{12}W$, $Cu_{15}W$ or $Cu_{20}W$ are acceptable for this situation (generally, materials $Cu_xW$ where $x \geq 12$).

Regarding the dimensions of the platelets (in particular, the thickness, which is associated with the thermal resistance of the platelets), exemplary embodiments have been formed where top platelet 12 has a thickness in the range of 100-300 μm, and bottom platelet 14 has a thickness in the range of 50-200 μm. All of these values (as well as material choices) are considered to be exemplary only; various other materials and dimensions may be found useful in specific embodiments of the present invention.

The provision of the inventive sandwich structure, as shown in FIGS. 5 and 6, allows for a "hard" solder (that is, a solder with a solidus point above 200° C.) to be used at each interface, thus creating an assembly that is sturdy and able to maintain its structural integrity during extreme environmental conditions, as compared to some prior art configurations that utilized a soft solder (i.e., a solder with a relatively low melting point).

In a preferred embodiment, heatsink 16 is formed of copper, or a copper composite material. The specific materials, as well as the dimensions of the heatsink, are chosen to create the desired stress and thermal resistance levels. If desired, macrochannel or microchannel coolers, well-known in the art, may be used in the formation of heatsink 16. Additionally, it is possible to select materials and dimensions such that the stress level seen by diode laser bar 10 provides a "best match" to the optimum configuration of the prior art: a laser diode bar mounted on a $Cu_{10}W$ submount attached to a heatsink.

As mentioned above, the utilization of the sandwich configuration of the present invention addresses concerns with respect to both thermal resistivity and stress management (in both the lateral and longitudinal directions). The stress profile in the lateral direction is associated with the curvature (or "smile") of the laser emission line, as described above and shown in FIG. 4. The stress profile in the longitudinal direction extends from the front facet to the back facet of the diode laser bar, where variations in stress in this direction are known to cause unwanted variations in the optical signal propagating along the longitudinal axis including, but not limited to, stress-induced birefringence and polarization variations.

Figure 7:
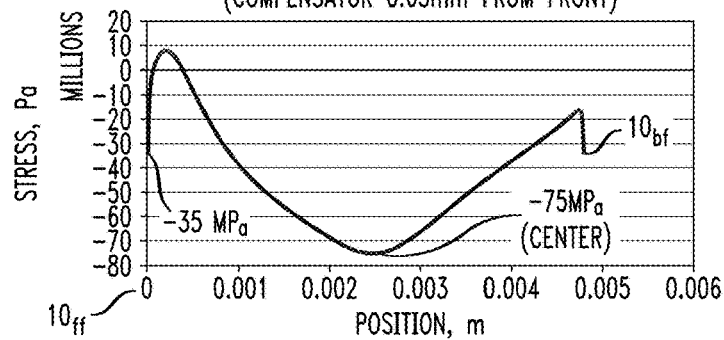
FIG. 7 is a graph of the longitudinal stress profile associated with a conventional prior art (submount-based) diode laser bar assembly.

FIG. 7 contains a graph of longitudinal stress along a diode laser bar of the prior art (such as shown in FIG. 1). In particular, the values shown in FIG. 7 were generated for diode laser bar that was attached to a $Cu_{10}W$ submount formed to have a thickness of 250 μm, where this particular configuration is considered to exhibit acceptable stress control. The computations were made along the length of the diode laser bar, from a front facet to an opposing, back facet. The lowest stress values were found in the central area of the bar, with higher values at either end. Thus, for the purposes of a "best match" selection, it is desired to create a sandwich mechanical stress management structure that creates a similar longitudinal stress profile, or one that does not exceed the observed stress levels.

Figure 8:
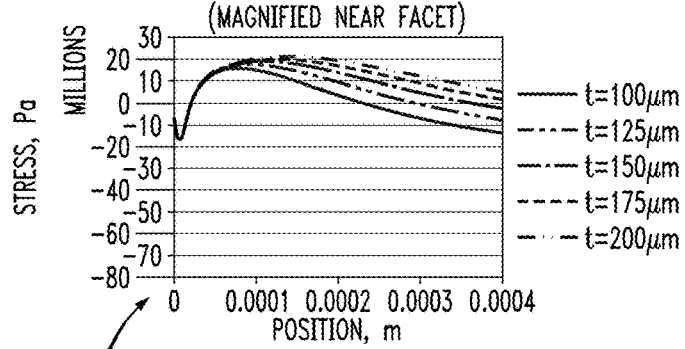
FIG. 8 is a graph of the longitudinal stress profile associated with an exemplary embodiment of the present invention, in this case utilizing top and bottom platelets of the same thickness, and each platelet formed of molybdenum.
Figure 8:
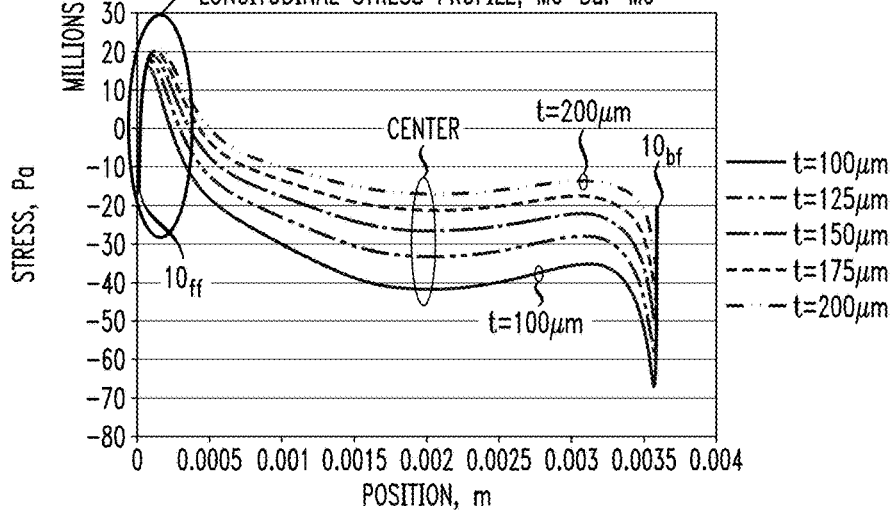

FIG. 8 is a plot of longitudinal stress profile for an exemplary sandwich-based diode laser bar assembly of present invention, in this case where molybdenum (Mo) is used as the material for both the top and bottom platelets (referred to at times hereinafter as a "Mo-Bar-Mo" embodiment). For the purposes of this particular analysis, the top and bottom platelets were formed to exhibit the same thickness. The illustrated profiles are shown for several different platelet thicknesses, ranging from 100-200 μm. The utilization of the sandwich structure is seen to introduce intense variations in stress near each end facet, with an enlarged portion of the measurement near front facet $10_{ff}$ also shown in FIG. 8.

Figure 9:
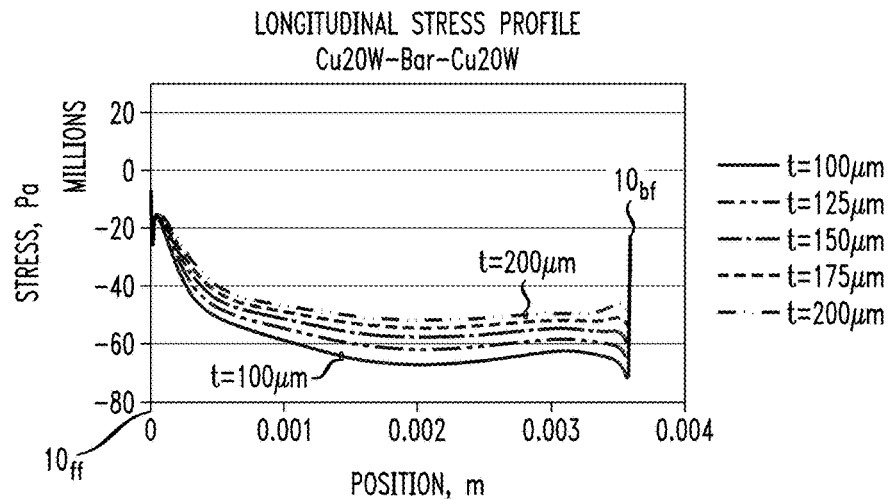
FIG. 9 is a graph of the longitudinal stress profile associated with another exemplary embodiment of the present invention, in this case utilizing a pair of $Cu_{20}W$ platelets of the same thickness.

FIG. 9 is a plot of longitudinal stress profiles for another embodiment of the present invention, in this case utilizing top and bottom platelets formed of $Cu_{20}W$ (i.e., a homogeneous mixture of 20% copper and 80% tungsten). Again, the platelet thickness values ranged between 100 and 200 μm. For these embodiments, it is shown that the compressive stress level approaches that of the prior art device (as represented by the plot of FIG. 7).

Figure 10:
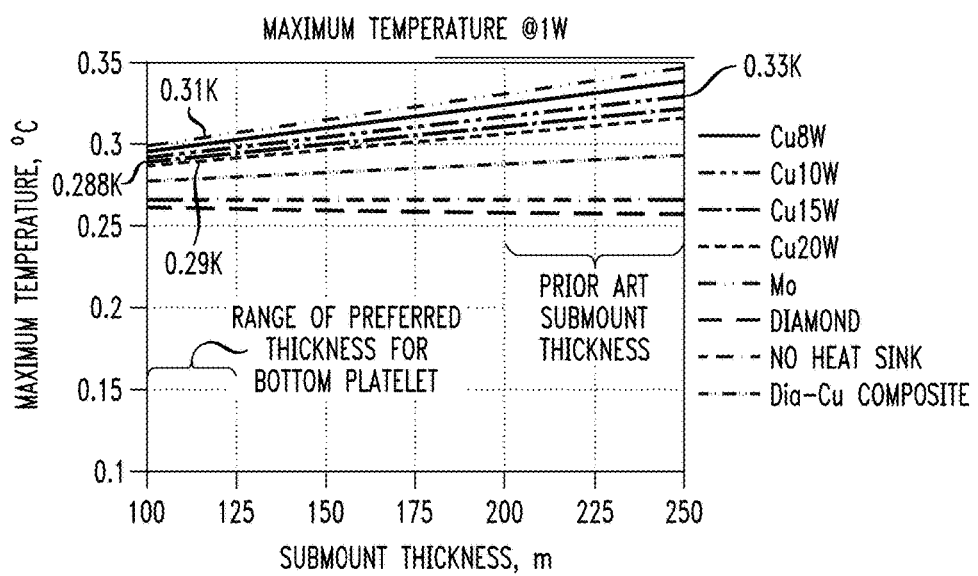
FIG. 10 contains a set of plots depicting thermal resistance as a function of bottom platelet thickness, illustrating the reduction in resistance as the plate thickness decreases.

FIG. 10 is a plot useful in understanding the thermal transfer properties of the present invention. Here, the properties of various materials that can be used for the bottom platelet are shown as a function of the thickness selected for this platelet. As mentioned above, one advantage of the sandwich configuration of the present invention is that the bottom platelet can be relatively thin, thus improving the heat transfer from the laser diode bar into the heatsink. The plots of FIG. 10 show that the use of a bottom platelet of molybdenum having a thickness of 100-125 μm (for example), yields a reduction of thermal resistance of about 6-10%, when compared to the prior art thickness Mo submounts. When a bottom platelet formed of $Cu_{20}W$ was studied, the reduction of thermal resistance was about 13% when compared to prior art $Cu_{20}W$ submounts (of larger thicknesses). In situations where the diode laser bar is used at elevated input current levels and/or generates hundreds of watts of output power, the ability to efficiently remove thermal energy from the diode laser bar is an important factor.

FIGS. 11-15 contain plots derived from the analysis of various three-dimensional models of low thermal resistance, stress-controlled diode laser bar assemblies formed in accordance with the present invention, comparing the results to conventional prior art configurations. The data for the inventive assembly configurations were collected presuming that heatsink 16 comprises a copper sheet, where three different thicknesses of copper were studied: 1.0 mm, 1.5 mm, and 2.0 mm. Only symmetric configurations were studied, that is, where the same material is used for both top platelet 12 and bottom platelet 14. These were compared to prior art structures utilizing a submount 4 of $Cu_{20}W$ or $Cu_{10}W$ (both of a thickness of 250 μm).

Figure 11:
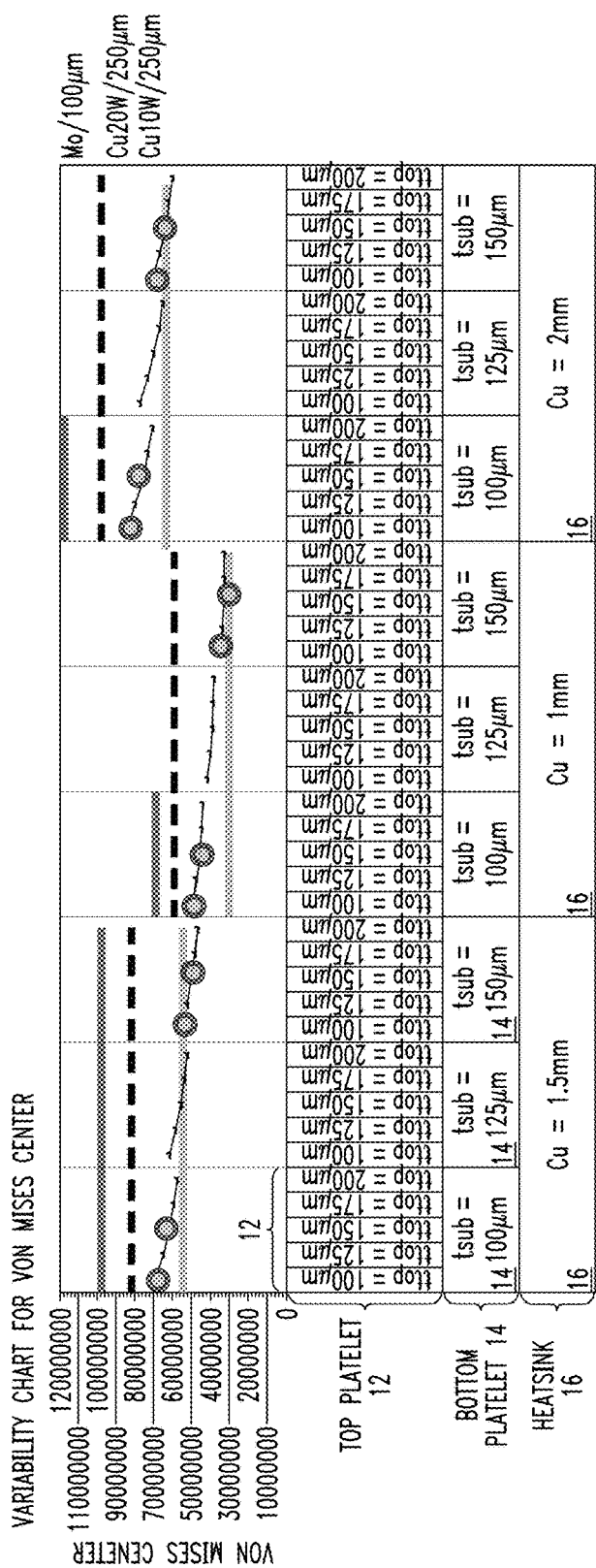
FIG. 11 contains a set of von Mises stress intensity values for center region
Figure 12:
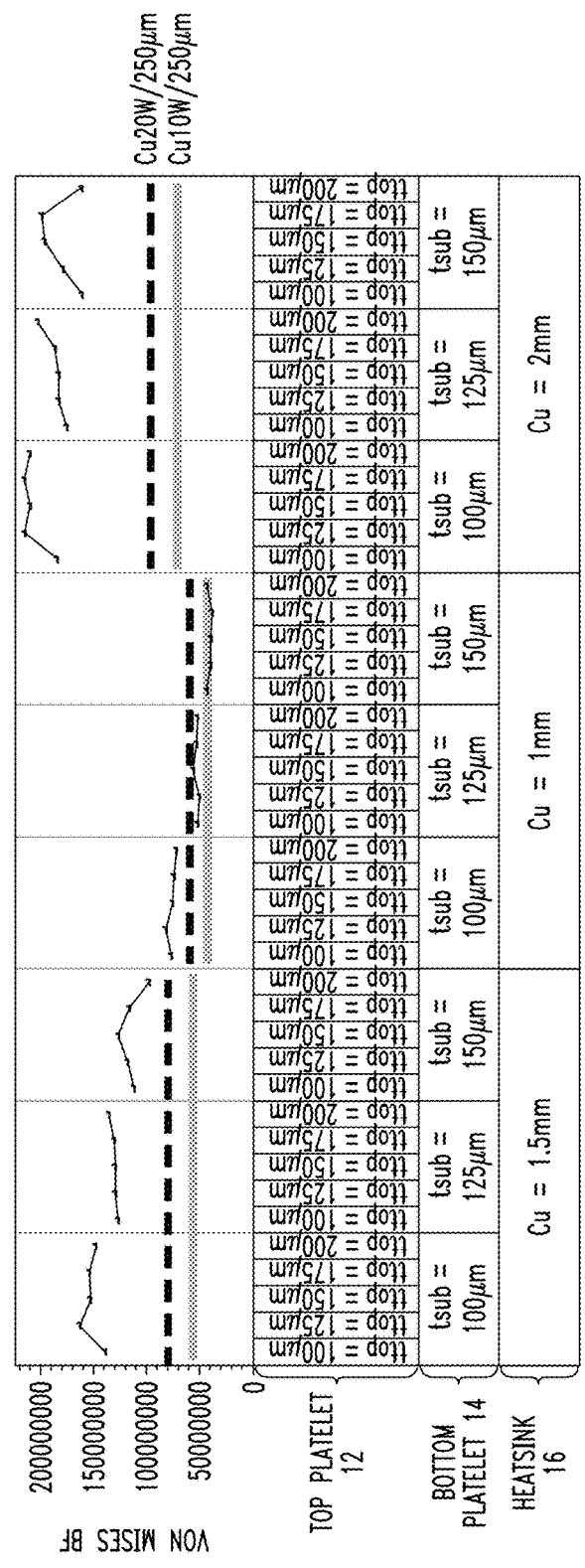
FIG. 12 contains a set of von Mises stress intensity values for back facet
Figure 13:
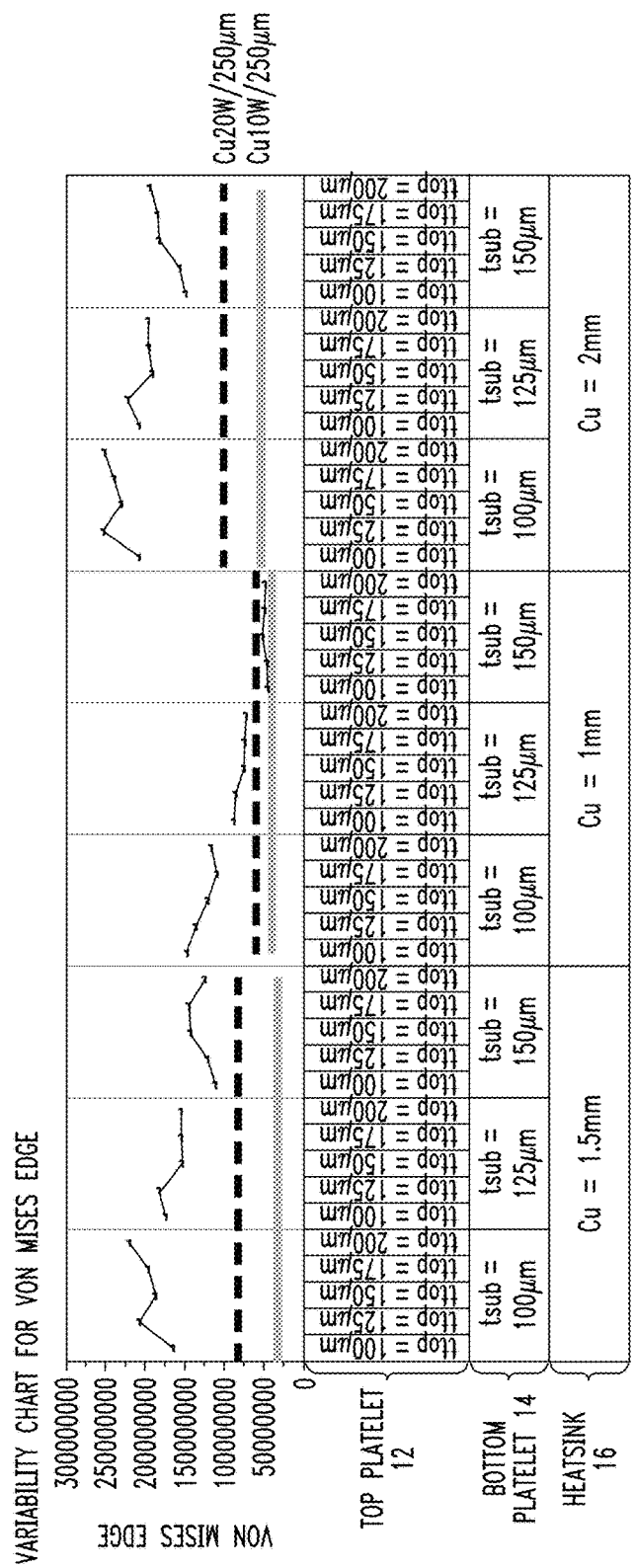
FIG. 13 contains a set of von Mises stress intensity values for an edge portion of diode laser bar.

In particular, the following plots shown in FIGS. 11-13 illustrate the von Mises stress (stress intensity) at various locations. The stress intensity is considered to be indicative of the reliability of the system under study, where lower values of the von Mises stress are associated with higher reliability. The von Mises stress is a calculated value indicative of stress intensity that is invariant over various coordinate systems, and considers only deviations from the isotropic (nominal) stress situation. In particular, the von Mises stress is defined (in the Cartesian coordinate system) as follows:

$$\sigma_v = \sqrt{\frac{1}{2}[(\sigma_x - \sigma_y)^2 + (\sigma_y - \sigma_z)^2 + (\sigma_z - \sigma_x)^2 + 6(\tau_{xy}^2 + \tau_{yz}^2 + \tau_{xz}^2)]},$$

where $\sigma_i$ defines stress along the indicated axial direction and $\tau_{ab}$ defines stress within plane ab.

In referring to the diagrams, the plots of FIG. 11 are the von Mises stress value calculated for the center area of the diode laser bar under a variety of different conditions. The three prior art calculations are shown for an Mo submount having a thickness of 100 μm, and for two different CuW submounts, one being $Cu_{20}W$ and the other being $Cu_{10}W$, both of the CuW submounts having a thickness of 250 μm. These values are then compared against 45 different variations of a diode laser bar assembly formed in accordance with the present invention. In particular, three different heatsink thicknesses were used (1.5 mm, 1.0 mm, and 2.0 mm), where for each heatsink thickness, three different bottom platelet thicknesses were studied (100 μm, 150 μm, and 200 μm). Then, for each bottom platelet thickness, a set of five different top platelet thicknesses were studied (100 μm, 125 μm, 150 μm, 175 μm, and 200 μm).

Referring to the particulars of FIG. 11, it is clear that when studying the von Mises stress intensity present at the center of the diode laser bar, the various configurations of the present invention best correlate to the prior art arrangements utilizing a $Cu_{10}W$ submount (or, in some cases, the $Cu_{20}W$ submount).

FIG. 12 contains similar plots, in this case providing a von Mises stress intensity value calculated at the rear facet of the diode laser bar. Here, the results are compared to only the prior art configurations utilizing a CuW submount. It is evident that a heatsink thickness of 1.0 mm in the inventive assembly provides a set of results that best matches the prior art stress intensity at the rear facet of the diode laser bar. Measurements of the stress intensity at a side edge of the diode laser bar are shown in FIG. 13, where again the use of a 1.0 mm submount in the inventive assembly best matches the results associated with the prior art, with a bottom platelet thickness of 150 μm providing the optimum matching for this heatsink thickness.

Figure 14:
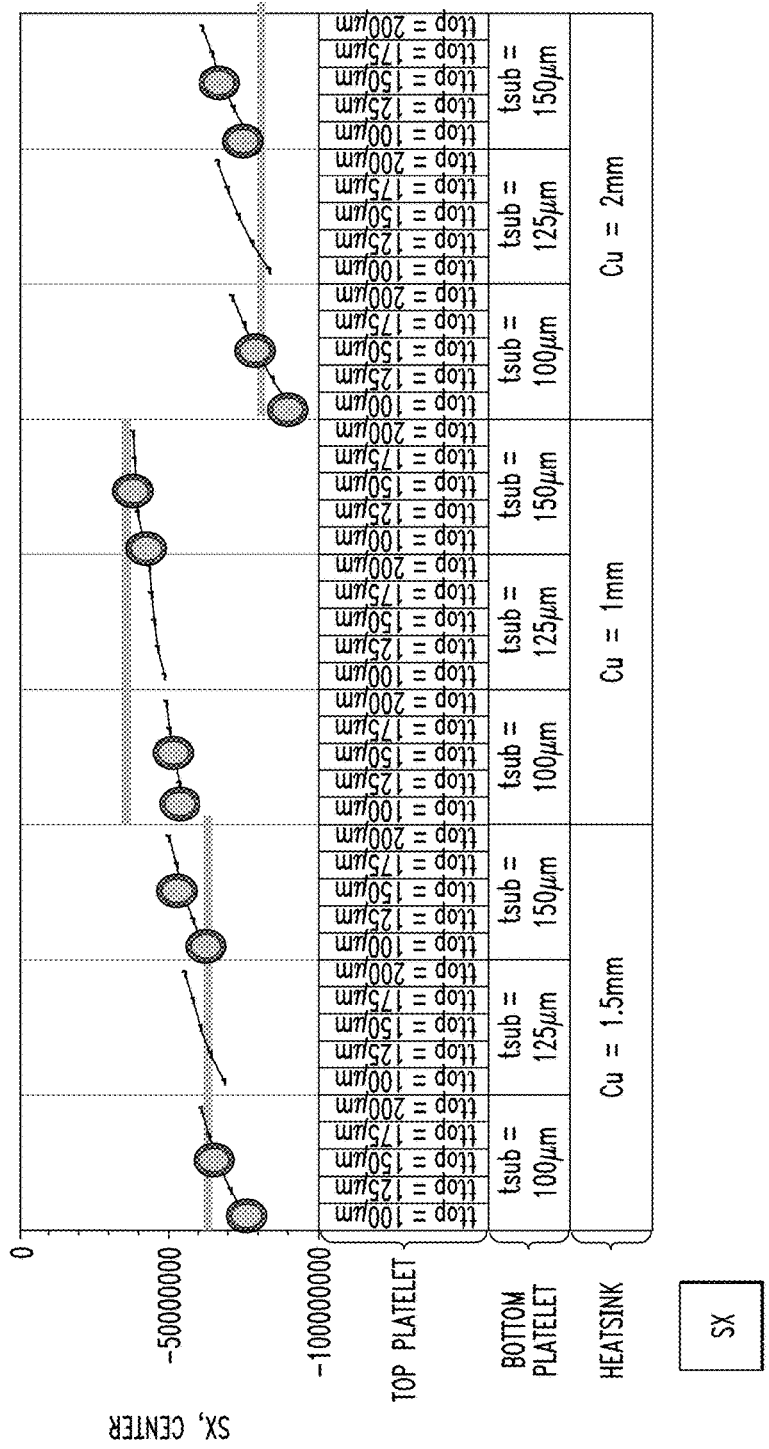
FIG. 14 contains a set of diagrams showing the $s_x$ component of the stress tensor (i.e., the stress parallel to the front facet in the major plane of the device)
Figure 15:
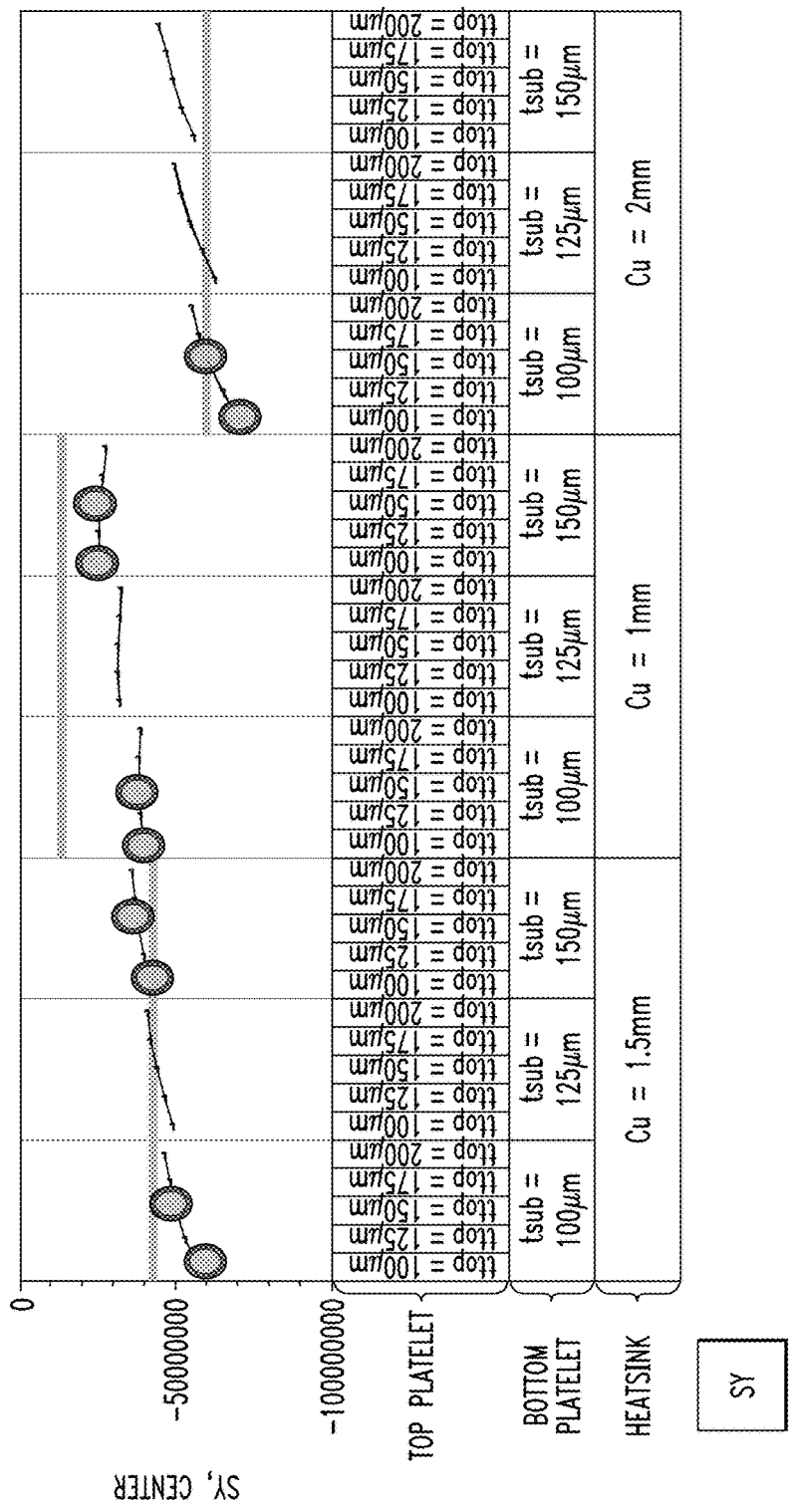
FIG. 15 contains a set of diagrams showing the $s_y$ component of the stress tensor (i.e., the stress perpendicular to the front facet and along the direction of the laser cavity).

As mentioned above, the ability to manage/control the stress within the diode laser bar assembly in accordance with the present invention also allows for polarization-maintaining configurations to be created, primarily by controlling the longitudinal stress profile. FIG. 14 is a graph of the stress parallel to the front facet in the major plane of the device (that is, along the x direction). These stress values were calculated for the same set of 45 different arrangements of the present invention, in this case compared to a prior $Cu_{10}W$ submount of a thickness of 250 μm. The stress state in the y direction (i.e., perpendicular to the front facet and along the length of the laser cavity) is shown in FIG. 13, for the same set of conditions. Minimal values of stress state are typically associated with configurations that provide the highest degree of polarization stability.

Additional advantages and modifications will readily occur to persons skilled in the art and the invention is therefore not limited to the specific embodiments and details shown and described above. Modifications may be made without departing from the spirit and scope of the general inventive concepts as defined in the appended claims.

What is claimed is:

1. A diode laser bar assembly comprising
a bar of semiconductor laser diodes including an array of emitter regions disposed in a lateral direction across a front facet of the bar, the bar including a bottom major surface and an opposing top major surface, the front facet extending orthogonally between the top and bottom major surfaces;
a heatsink;
a bottom platelet disposed between the heatsink and the bottom major surface of the bar of semiconductor laser diodes, the bottom platelet comprising a material and thickness chosen to create a low thermal resistance path between the bar of semiconductor laser diodes and the heatsink, providing heat flow from the bar of semiconductor laser diodes to the heatsink in a direction perpendicular to the major surfaces of the bar of semiconductor laser diodes, with the bottom platelet affixed in place using a suitable solder material; and
a top platelet disposed over and affixed to the top major surface of the bar of semiconductor laser diodes, the dimensions and materials of the top platelet chosen to manage mechanical stress conditions within the assembly and reduce curvature across the array of emitter regions.

2. The diode laser bar assembly of claim 1 wherein the bottom platelet and the top platelet are formed of the same material.

3. The diode laser bar assembly of claim 2 wherein the material used to form the bottom platelet and top platelet is selected from the group consisting of: molybdenum, silicon, and $Cu_xW$ ($x \leq 8$).

4. The diode laser bar assembly of claim 2 wherein the material used to form the bottom platelet and top platelet is selected from the group consisting of $Cu_xW$, where $x \geq 12$.

5. The diode laser bar assembly of claim 1 wherein the bottom platelet and the top platelet are formed of different materials.

6. The diode laser bar assembly of claim 5 wherein the materials used to form the bottom platelet and top platelet are selected from the group consisting of: molybdenum, silicon, and $Cu_xW$ ($x \leq 8$), each platelet formed of a different material.

7. The diode laser bar assembly as defined in claim 1 wherein the top platelet and bottom platelet are formed to exhibit essentially the same thickness.

8. The diode laser bar assembly as defined in claim 7 wherein the thickness of the top and bottom platelets is within the range of about 100 µm to 300µm.

9. The diode laser bar assembly as defined in claim 1 wherein the top platelet and bottom platelet are formed to exhibit different thicknesses.

10. The diode laser bar assembly as defined in claim 9 wherein the bottom platelet is formed of a thickness less than the thickness of the top platelet, the smaller thickness of the bottom platelet providing a low thermal resistance path to the heatsink.

11. The diode laser bar assembly as defined in claim 9 wherein the bottom platelet exhibits a thickness in the range of 50 µm to 200 µm, and the top platelet exhibits a thickness in the range of 100 µm to 300 µm.

12. The diode laser bar assembly as defined in claim 1 wherein a solder having a solidus temperature of at least 200° C. is used to affix the bottom platelet between the heatsink and the bottom major surface of the bar of semiconductor laser diodes.

13. The diode laser bar assembly as defined in claim 12 wherein the solder comprises AuSn.

14. The diode laser bar assembly as defined in claim 12 wherein a solder having a solidus temperature of at least 200° C. is used to affix the top platelet to the top major surface of the bar of semiconductor laser diodes.

15. The diode laser bar assembly as defined in claim 14 wherein the solder comprises AuSn.

16. The diode laser bar assembly as defined in claim 1 wherein the bar of semiconductor laser diodes comprises a III-V based bar of semiconductor laser diodes, exhibiting a coefficient of thermal expansion (CTE) of about 6.5 ppm/K, and the heatsink comprises a copper material having a CTE of about 16 ppm/K.

17. The diode laser bar assembly as defined in claim 16 wherein the top and bottom platelets are formed of a material having a CTE in the range of about 2 ppm/K to 6 ppm/K.

* * * * *